United States Patent [19]

Hosier et al.

[11] Patent Number: 5,696,626

[45] Date of Patent: Dec. 9, 1997

[54] PHOTOSENSITIVE SILICON CHIP HAVING A RIDGE NEAR AN END PHOTOSITE

[75] Inventors: Paul A. Hosier, Rochester; Jagdish C. Tandon, Fairport; Josef E. Jedlicka, Rochester; Brian T. Ormond, Webster, all of N.Y.

[73] Assignee: Xerox Corporation, Stamford, Conn.

[21] Appl. No.: 542,247

[22] Filed: Oct. 12, 1995

[51] Int. Cl.⁶ .................................... H04N 1/04
[52] U.S. Cl. ............... 358/482; 358/513; 257/620; 250/208.1
[58] Field of Search .................. 358/505, 512, 358/513, 514, 482, 483; 257/466, 620; 250/208.1; H04N 1/04

[56] References Cited

U.S. PATENT DOCUMENTS

| | | | |
|---|---|---|---|
| 4,214,264 | 7/1980 | Hayward et al. | 358/512 |
| 4,364,078 | 12/1982 | Smith et al. | 257/620 |
| 4,410,580 | 10/1983 | Okutsu | 257/620 |
| 4,985,760 | 1/1991 | Maeshima et al. | 358/512 |
| 5,430,325 | 7/1995 | Sawada et al. | 257/620 |

FOREIGN PATENT DOCUMENTS

| | | | |
|---|---|---|---|
| 0057563 | 4/1984 | Japan | 358/482 |
| 60-261245 | 12/1985 | Japan | 358/482 |

*Primary Examiner*—Thomas L. Stoll
*Attorney, Agent, or Firm*—R. Hutter

[57] ABSTRACT

A photosensitive chip, such as used in a scanner or facsimile, defines a linear array of photosites, each photosite being covered with a filter formed from a cured translucent liquid. At the critical ends of the chip, between the end photosite in the array and the edge of the chip, there is provided a ridge which protrudes over the thickness of the filter. This ridge maintains the physical integrity of the filter.

10 Claims, 4 Drawing Sheets

PHOTOSENSITIVE SILICON CHIP HAVING A RIDGE NEAR AN END PHOTOSITE

The present invention relates to photosensitive chips for creating electrical signals from an original image, as would be found, for example, in a digital scanner or facsimile machine. More specifically, the present invention relates to a design for a photosensitive chip which is particularly useful with a thin-film color filter attached thereto.

As copying and scanning of color hard-copy documents becomes more prevalent in the business world, there has arisen a need for full-color solid-state photosensitive devices, such as a silicon chip having an array of photosensors thereon. One preferred method for causing the photosensors on the silicon chip to be sensitive to a specific primary color is to provide, on the main surface of the silicon chip, a layer of spectrally translucent filter material, such as polyimide or acrylic, which has been dyed or pigmented to a specific primary color. If a single photosensitive chip is intended to have multiple linear arrays of photosensors, each linear array being sensitive to one particular primary color, particular polyimide layers are applied to specific linear arrays, thereby creating a full-color photosensitive chip.

One typical method of construction of full-color photosensitive chip is to first create a wafer having a relatively large number, such as one hundred or more, of semiconductor structures, each structure corresponding to one chip. Filters are applied to the structures on the wafer so that filter areas will be applied to the desired linear arrays of photosensors on each chip structure. Typically this application of filter material is carried out by applying an even layer of translucent liquid to the entire wafer, and then etching away, such as by a laser, the wet or dry cured layer of translucent material except in those areas on the chip structure where the filter is desired to be placed. For full-color chips, multiple layers of translucent filter material are applied to the wafer, and then etched away as needed, to yield the three primary-color-filtered linear arrays of photosensors. Only after the filter layers are applied as desired is the wafer "diced," or sawed into individual chips. According to a preferred technique, the chip termination is a combination of chemically-etched v-groove and a mechanically sawed portion. The diced chips are first tested and screened for defective chips, and the usable chips are then abutted into a longer linear array.

In the construction of full-color photosensitive chips having translucent filter layers attached thereto, certain practical problems have become evident. One problem concerns the uniformity of thickness of the filter layer among a large plurality of individual photosensors on a single chip. The process of applying liquid filter material to the chip and then curing the material may cause the cured filter material to be thicker on some photosensors than on others. Expectably, different thicknesses of filter material effect the intensity of light reaching through the filter material to a particular photosensor. It is therefore desirable that the thickness of the filter layer be as even as possible for all photosensors of a particular type on a single chip, and further on every photosensor among a large plurality of chips in a single scanning apparatus. Another practical problem is the inadvertent ripping or other damage to the cured filter layers when the wafer is diced into individual chips: the relatively thin translucent filter layer, particularly at the photosensors toward either end of the chip, can be torn by the action of a saw blade.

According to one aspect of the present invention, there is provided a photosensitive device, comprising a semiconductor chip. A plurality of photosites are defined on a surface of the chip, arranged in a linear array. A ridge protrudes from the surface of the chip at one end of the linear array, the ridge extending along an edge of the end photosite between the end photosite and a edge of the surface of the chip.

According to another aspect of the present invention, there is provided a photosensitive device, comprising a semiconductor chip. A plurality of photosites are defined on a surface of the chip, each photosite defining a perimeter, the photosites being arranged in a linear array. A light-transmissive filter material covers an end photosite in the linear array. A ridge protrudes from the surface of the chip. The ridge extends adjacent to a perimeter of an end photosite in the linear array between the end photosite and an edge of the surface of the chip. The ridge is of a height relative to a main surface of the end photosite greater than a thickness of the light-transmissive filter material.

Figure 1:
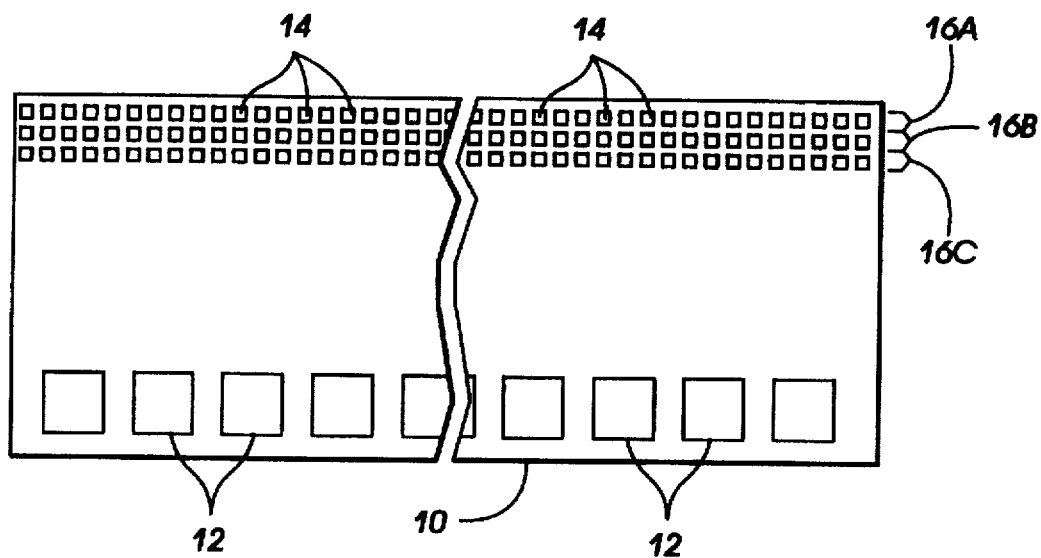
FIG. 1 is a plan view of a single photosensitive chip of a general design found, for example, in a full-color photosensor scanner.

FIG. 1 is a plan view of a single photosensitive chip, generally indicated as 10, of a general design found, for example, in a full-color photosensor scanner. A typical design of a full-page-width scanner will include a plurality of chips 10, each chip being approximately one-half to one inch in length, the chips being butted end-to-end to form an effective collinear array of photosensors, which extends across a page image being scanned. Each chip 10 is a silicon-based integrated circuit chip having defined in a main surface thereof three independently-functioning linear arrays of photosensors, each photosensor being here indicated as 14. The photosensors are disposed in three parallel rows which extend across a main dimension of the chip 10, these individual rows being shown as 16a, 16b, and 16c. Each individual row of photosensors on chip 10 can be made sensitive to a particular color, by applying to the particular row 16a, 16b, 16c a spectrally translucent filter layer which covers only the photosensors in a particular row. In a preferred embodiment of the present invention, the three rows of photosensors are each filtered with a different primary color, such as red, green, and blue. Generally, each individual photosensor 14 is adapted to output a charge or voltage signal indicative to the intensity of light of a certain type impinging thereon; various structures, such as transfer circuits, or charge-coupled devices, are known in the art for processing signal output by the various photosensors corresponding to photosites 14.

Figure 2:
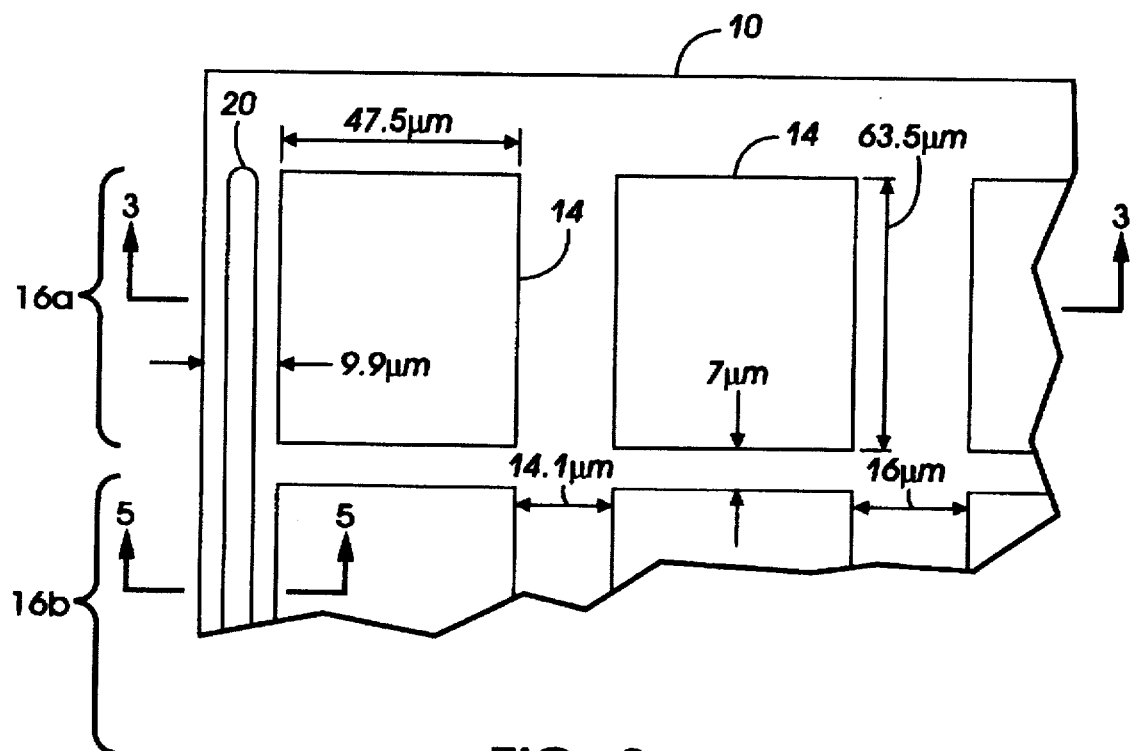
FIG. 2 is a detailed plan view showing the relative spacings of representative photosites on the chip.

FIG. 2 is a detailed plan view showing the relative spacings of representative photosites 14 in two rows 16a, 16b, in detail. Each photosite 14 is of a generally rectangular shape, defining a perimeter, the perimeter of each photosite being spaced from the perimeter of a neighboring photosite by a spacing distance. According to one preferred design of a three-row, full-color photosensitive chip, for an image resolution of 400 spots per linear inch, each photosite 14 has a dimension in the plan-view direction of 47.5 micrometers along the direction of extension of the linear arrays, and 63.5 micrometers along the direction perpendicular to the direction of extension of the linear arrays. Further, a desirable spacing between the borders of adjacent photosites 14 is approximately seven micrometers from one border of a photosite 14 in row 16a to the border of a neighboring photosite in row 16b. Along the length of the linear array, the spacing between borders of adjacent photosites within a particular row 16 is approximately fourteen to sixteen micrometers, as some designs of photosensitive chips will have various distances between different pairs of adjacent photosites for optical purposes. As used in the claims herein, each individual row 16a, 16b, 16c can be considered an individual linear array, and therefore, according to the claims herein, the "spacing distance" shall be considered the distance between a perimeter of one photosite to the nearest perimeter of a neighboring photosite in the same linear array.

According to a key aspect of the present invention, there is provided a ridge 20 which protrudes from the main surface of the chip, and is disposed to extend between the perimeter of an end photosite 14 disposed at the end of a particular chip 10, and the edge of the chip, as shown in FIG. 2. The illustrated embodiment of the present invention shows a spacing of 9.9 micrometers from the perimeter of the photosite 14 at the end of a particular row such as 16a and the edge of the chip. This ridge 20 protrudes a significant distance from the main surface of the chip, typically about 0.8 to 1.2 micrometers from the surface formed by the end photosite 14. Example dimensions of photosites 14 and the spacings therebetween are shown in FIG. 2 as well.

Figure 3A:
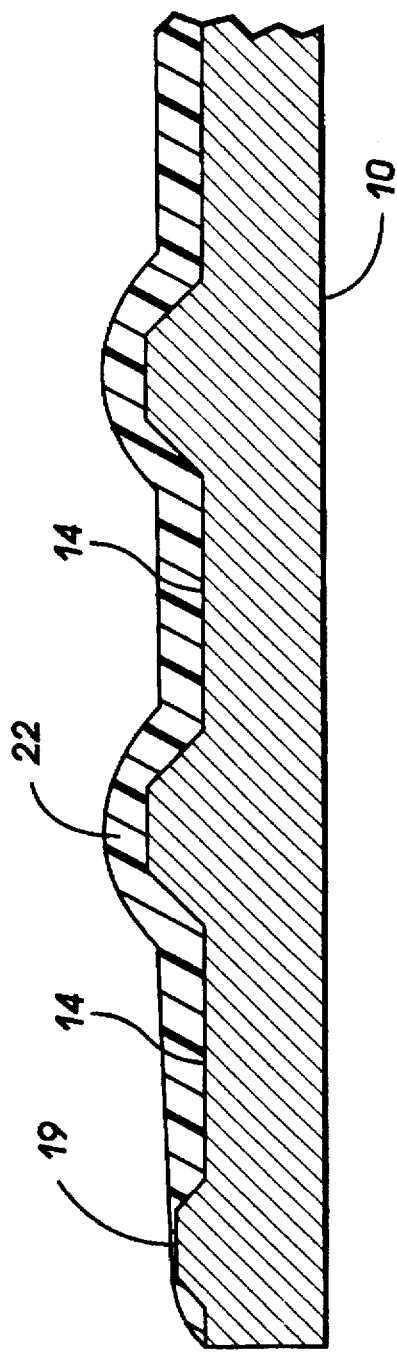
FIGS. 3A and 3B are comparative cross-sectional views, through line 3—3 in FIG. 1, of a chip, respectively showing the behavior of a filter layer with and without the ridge according to the present invention.
Figure 3B:
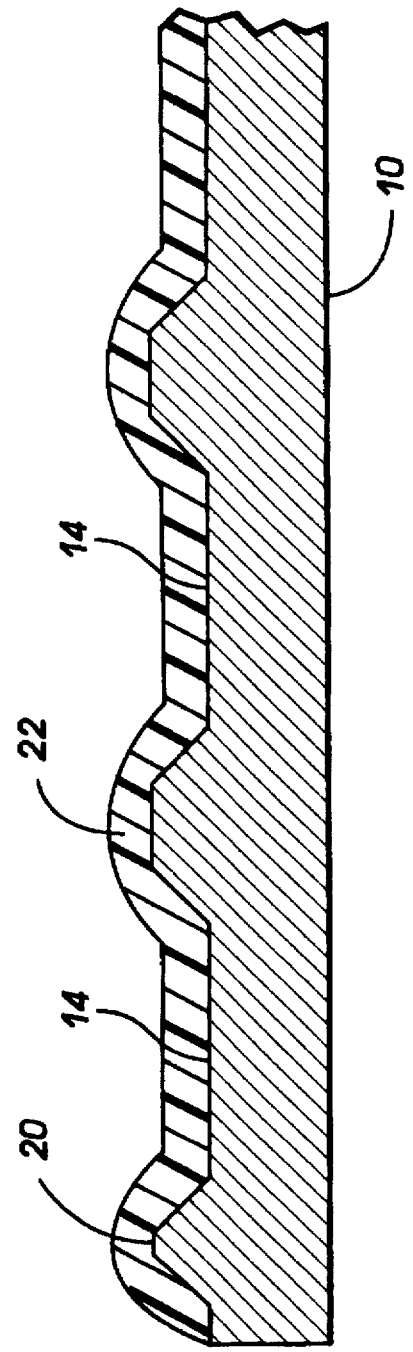

The ridge 20 provides many practical advantages to the chip 10. FIGS. 3A and 3B are comparative cross-sectional views, showing only the basic cross-sectional outline of a chip 10, giving a comparison of the behavior of a fluid filter material to a chip 10 with and without ridge 20 disposed between the end photosite 14 and the edge of the chip 10. FIG. 3A shows the behavior of a filter material 22, which is applied to chip 10 in a liquid state and then cured to harden, where the ridge between the end photosite 14 and the edge of the chip 10 is not particularly pronounced, such as shown by 19. Here it can be seen that the filter material 22 over the edge pixel can thin or "leak over" the relatively short ridge 19, before curing or dicing, so that the filter material is not evenly distributed over the end pixel 14. Of course, the lack of uniformity of the filter material will effect the total amount of light transmitted through the filter material onto the end photosite, and thus create a source of error for signals from the end photosite.

FIG. 3B is an equivalent sectional view as in FIG. 3A, showing the behavior of filter material 22 when there is provided a suitably large ridge 20 between end photosite 14 and the edge of the chip 10. The relatively high ridge 20 can serve to retain the liquid-cured filter material 22 over the end photosite 14, so that the filter material is evenly distributed over the surface of end photosite 14, and also so that the end photosite 14 has an equal amount of filter material thereon as any other photosite 14 on the chip 10.

Figure 4A:
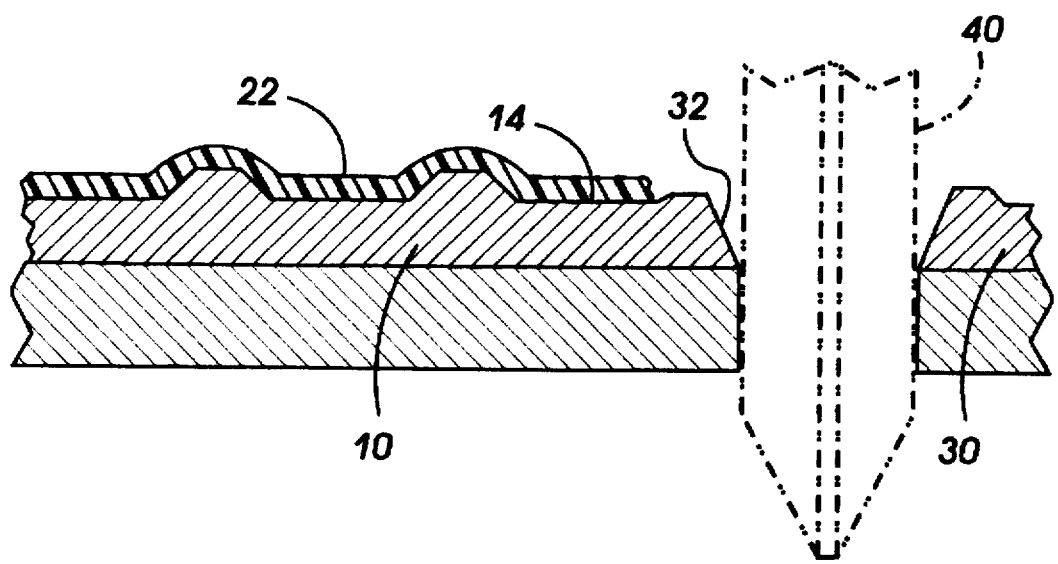
FIGS. 4A and 4B are comparative cross-sectional views of a chip, respectively showing the behavior of a filter layer interacting with a saw blade, with and without the ridge according to the present invention.
Figure 4B:
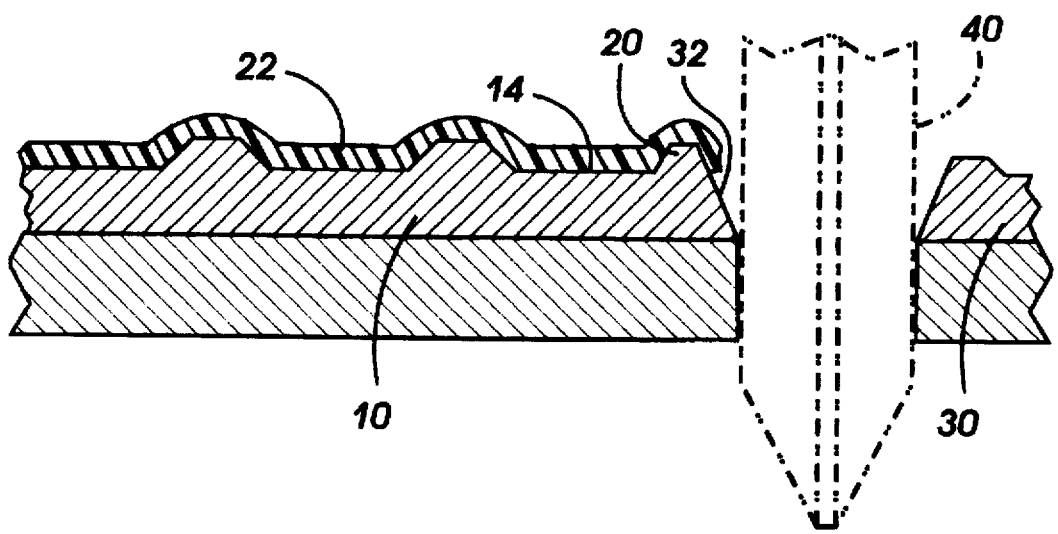

In situations where an entire wafer, having a large number of chips thereon, is applied with filter material, and then the wafer is diced to form individual chips, it is common that at least part of the dicing process is performed with a mechanical saw, such as a circular diamond blade. The ridge of the present invention can be used to maintain the integrity of a filter layer during the mechanical dicing process. FIGS. 4A and 4B are partial sectional views of a representative chip 10, during the process of separation from the rest of a wafer, here indicated as 30. According to one preferred technique for precision dicing of chips 10, there is at first provided a chemically-etched v-groove, here indicated as 32, to mark the precise demarcation of the border of the chip 10. When a filter layer 22 is applied to the wafer, and then the wafer is diced to form a chip 10, the action of the mechanical dicing blade 40 which separates the chip 10 from the rest of the wafer 30 can tear away a significant amount of filter material from the surface of the end photosite 14. This tearing of too much filter material, which will cause the entire chip 10 to be rejected, is illustrated in FIG. 4A. FIG. 4B, in contrast, shows how the presence of a significant ridge 20, of a preferred type, can effectively insulate the filter material on the end photosite 14 from the destructive effects of the dicing blade 40, thus retaining the integrity of the filter material over the end photosite 14.

According to a preferred embodiment of the present invention, a typical thickness of a filter material 22 over a chip 10 is approximately 1.0 to 2.0 micrometers. In order to be effective, the upward dimension of protrusion of the ridge 20 should be roughly comparable to the thickness of the filter layer 22, preferably in the range of 0.8 to 1.2 micrometers. By keeping the height of the ridge 20 roughly comparable to the thickness of the filter layer 22, the advantages of ridge 20, such as maintaining an even thickness of filter layer 22, and preventing ripping of filter layer 22, can be attained.

Figure 5:
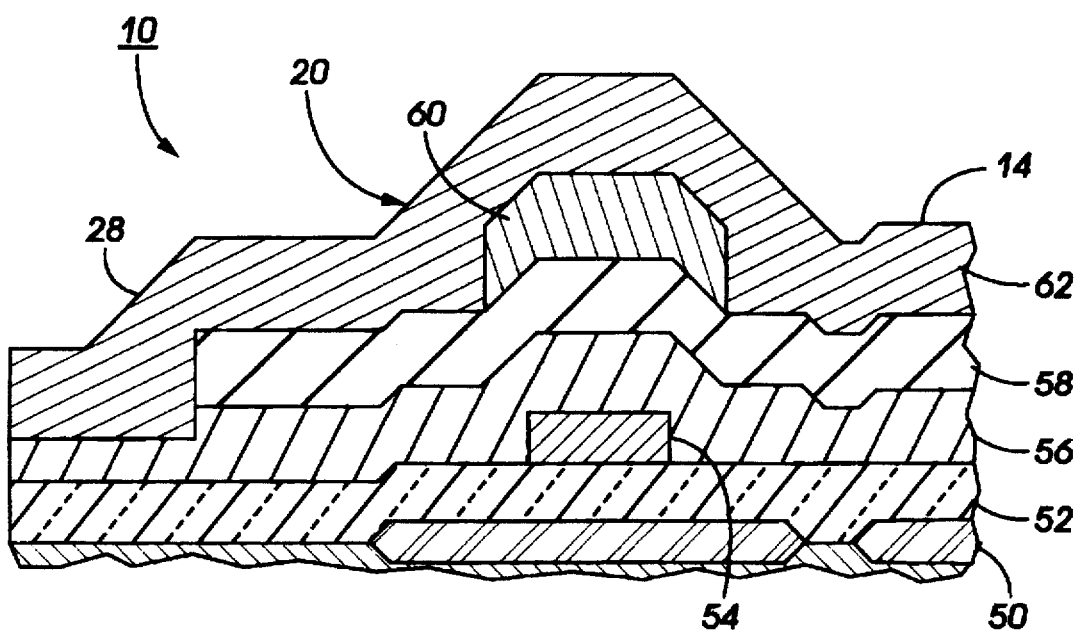
FIG. 5 is a detailed cross-sectional view, through line 5—5 in FIG. 1, showing the internal structure of a preferred embodiment of a ridge on a chip according to the present invention.

Another advantage of the ridge 20 disposed between the end photosite and the edge of the chip is that the ridge 20 provides room for ancillary structures which are convenient for carrying out other purposes of the photosensitive chip. FIG. 5 is a detailed sectional view showing individual layers of semiconductor structure which is used to build up a ridge 20 of necessary height, according to a preferred embodiment of the present invention. The view shown in FIG. 5 corresponds to the cross-section through line marked 5—5 in FIG. 2. In general, all of the interconnect layers on the chip 10 are formed on a field oxide indicated as 50. Above this field oxide is a borophosphosilicon glass, indicated as 52. There is also a metal structure 54, which is typically made of aluminum, first and second layers 56 and 58 of "intermetal oxide," and further a light shield indicated as 60. The topmost layer of both ridge 20 and the neighboring structures on the chip is a top oxide layer here indicated as 62.

A convenient function of the metal layer 54 is to serve as a lead to one or another photosites besides the photosite which the metal layer 54 borders. For example, if the particular end photosite 14 shown in FIG. 5 is in row 16b such as in FIG. 1, the metal layer 54 can serve as a lead connecting another end photosite, such as in row 16a in FIG. 1, to circuitry on the chip. The lead formed by metal layer 54 can access a ground line, or a "guard-ring" defining the photosensitive area on the chip 10. In a typical design of a chip such as 10, each area between every neighboring pair of photosensors 14 is used as a space for a lead so that all of the photosensors, in various rows 16a–c, can access the circuitry on the chip. The use of the metal layer 54 in ridge 20 adds another lead which can be used, thus facilitating a more elegant configuration of leads in the chip 10 as a whole.

The light shield 60 extends over the lead 54. The light shield 60 is preferably made of aluminum. One key function of light shield 60 is to define the photosensitive area of the end photosite 14 by providing a uniformly conductive, as well as light-shielding, border to the end photosite 14. Also, the light shield 60 can be used to add a predetermined amount of capacitance associated with lead 54, so that the parasitic capacitance associated with lead 54 can be roughly equalized to the capacitance associated with leads which are disposed between neighboring photosites along an array. Thus the light shield 60 can create a better photoelectric symmetry on both edges of the end photosite 14, thus contributing to a better uniformity of the charge or voltage signal from end photosite 14. Further, both metal layer 54 and light shield 60 contribute to the increased height of the ridge 20 as a whole, thus enhancing the desirable property of ridge 20 for retaining a translucent filter layer on photosite 14.

Also shown in FIG. 5 is a groove 28 defined toward the edge of the chip 10, which causes the very edge of chip 10 to be lower relative to the main surface of end photosite 14. It has been found that the addition of the groove 28, in combination with the ridge 20, further enhances the ability of the chip 10 to retain a uniform filter layer thereon without damage from, for example, the dicing process.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A photosensitive device, comprising:
   a semiconductor chip;
   a plurality of photosites defined on a surface of the chip, the photosites being arranged in a linear array;
   a ridge directly attached to the chip and protruding from the surface of the chip at one end of the linear array, the ridge extending along an edge of the end photosite between the end photosite and a edge of the surface of the chip; and
   a light-transmissive filter material covering the end photosite.

2. The device of claim 1, each photosite defining a perimeter, the perimeter of an end photosite disposed at one end of the linear array being spaced from the perimeter of a neighboring photosite by a predetermined spacing distance, the distance between the perimeter of the end photosite and an edge of the surface of the chip being less than the predetermined spacing distance.

3. The device of claim 1, the ridge having a height relative to the photosite of not less than 0.8 micrometers.

4. The device of claim 1, further defining a groove, forming a valley relative to a main surface of the end photosite, disposed between the ridge and an edge of the surface of the chip.

5. The device of claim 1, the light-transmissive filter material having a thickness less than a height of the ridge relative to a main surface of the end photosite.

6. A photosensitive device, comprising:
   a semiconductor chip;
   a plurality of photosites defined on a surface of the chip, the photosites being arranged in a linear array;
   a ridge directly attached to the chip and protruding from the surface of the chip at one end of the linear array, the ridge extending along an edge of the end photosite between the end photosite and a edge of the surface of the chip; and
   a linear conductor disposed inside the chip underneath an outer surface of the ridge.

7. The device of claim 6, further comprising a capacitive shield disposed underneath an outer surface of the ridge, between the conductor and the outer surface of the ridge.

8. A photosensitive device, comprising:
   a semiconductor chip;
   a plurality of photosites defined on a surface of the chip, each photosite defining a perimeter, the photosites being arranged in a linear array;
   a light-transmissive filter material covering an end photosite in the linear array; and
   a ridge directly attached to the chip and protruding from the surface of the chip, the ridge extending adjacent to a perimeter of the end photosite in the linear array between the end photosite and an edge of the surface of the chip, the ridge having a height relative to a main surface of the end photosite greater than a thickness of the light-transmissive filter material.

9. The device of claim 8, the ridge having a height relative to the photosite of not less than 0.8 micrometers.

10. A photosensitive device, comprising:
    a semiconductor chip;
    a plurality of photosites defined on a surface of the chip, each photosite defining a perimeter, the photosites being arranged in a linear array;
    a light-transmissive filter material covering an end photosite in the linear array; and
    a ridge protruding from the surface of the chip, the ridge extending adjacent to a perimeter of the end photosite in the linear array between the end photosite and an edge of the surface of the chip, the ridge having a height relative to a main surface of the end photosite greater than a thickness of the light-transmissive filter material; and a linear conductor disposed inside the chip underneath an outer surface of the ridge.

* * * * *